(12) United States Patent
Forbes

(10) Patent No.: US 7,439,576 B2
(45) Date of Patent: Oct. 21, 2008

(54) ULTRA-THIN BODY VERTICAL TUNNELING TRANSISTOR

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 492 days.

(21) Appl. No.: 11/215,468

(22) Filed: Aug. 29, 2005

(65) Prior Publication Data

US 2007/0045721 A1  Mar. 1, 2007

(51) Int. Cl.
*H01L 29/792* (2006.01)
(52) U.S. Cl. ................................... 257/324
(58) Field of Classification Search .............. 257/213, 257/263, 324, 329
See application file for complete search history.

(56) References Cited

U.S. PATENT DOCUMENTS

| | | | |
|---|---|---|---|
| 5,382,540 A * | 1/1995 | Sharma et al. ........... 438/259 |
| 5,646,900 A | 7/1997 | Tsukude et al. |
| 5,909,618 A | 6/1999 | Forbes et al. |
| 6,097,065 A | 8/2000 | Forbes et al. |
| 6,104,061 A | 8/2000 | Forbes et al. |
| 6,104,068 A | 8/2000 | Forbes |
| 6,150,687 A | 11/2000 | Noble et al. |
| 6,191,448 B1 | 2/2001 | Forbes et al. |
| 6,320,222 B1 | 11/2001 | Forbes et al. |
| 6,350,635 B1 | 2/2002 | Noble et al. |
| 6,355,961 B1 | 3/2002 | Forbes |
| 6,376,317 B1 | 4/2002 | Forbes et al. |
| 6,377,070 B1 | 4/2002 | Forbes |
| 6,399,979 B1 | 6/2002 | Noble et al. |
| 6,413,825 B1 | 7/2002 | Forbes |
| 6,414,356 B1 | 7/2002 | Forbes et al. |
| 6,424,001 B1 | 7/2002 | Forbes et al. |
| 6,448,601 B1 | 9/2002 | Forbes et al. |
| 6,492,233 B2 | 12/2002 | Forbes et al. |
| 6,496,034 B2 * | 12/2002 | Forbes et al. ........... 326/41 |
| 6,504,201 B1 | 1/2003 | Noble et al. |
| 6,531,727 B2 | 3/2003 | Ahn et al. |
| 6,559,491 B2 | 5/2003 | Forbes et al. |
| 6,566,682 B2 | 5/2003 | Forbes |
| 6,639,268 B2 | 10/2003 | Forbes et al. |
| 6,664,143 B2 * | 12/2003 | Zhang ........... 438/138 |
| 6,664,806 B2 | 12/2003 | Forbes et al. |
| 6,900,521 B2 | 5/2005 | Forbes et al. |

(Continued)

OTHER PUBLICATIONS

K. Shimomura et al., "A IV 46ns 16Mb SOI-DRAM with body control technique", Dig. IEEE Int. Solid-State Circuits Conf, San Francisco, pp. 68-69, 1997.

(Continued)

*Primary Examiner*—Calvin Lee
(74) *Attorney, Agent, or Firm*—Leffert Jay & Polglaze, P.A.

(57) ABSTRACT

A vertical tunneling, ultra-thin body transistor is formed on a substrate out of a vertical oxide pillar having active regions of opposing conductivity on opposite ends of the pillar. In one embodiment, the source region is a p+ region in the substrate under the pillar and the drain region is an n+ region at the top of the pillar. A gate structure is formed along the pillar sidewalls and over the body layers. The transistor operates by electron tunneling from the source valence band to the gate bias-induced n-type channels, along the ultra-thin silicon bodies, thus resulting in a drain current.

16 Claims, 7 Drawing Sheets

U.S. PATENT DOCUMENTS

| | | |
|---|---|---|
| 2002/0110032 A1 | 8/2002 | Forbes |
| 2004/0007724 A1 | 1/2004 | Murthy et al. |
| 2004/0147079 A1 | 7/2004 | Forbes et al. |
| 2005/0106811 A1 | 5/2005 | Forbes |

OTHER PUBLICATIONS

J.P. Denton et al., "Fully Depleted Dual-Gated Thin-Film SOI P-MOSFET's Fabricated in SOI Islands with an Isolated Buried Polysilicon Backgate", IEEE Electron Device Letter, vol. 17, No. 11, pp. 509-511, Nov. 1996.

X. Huang et al., "Sub-50 nm P-Channel FinFET", IEEE Transactions on Electron Devices, vol. 48, No. 5, May 2001.

K. Kim et al., "Nanoscale CMOS Circuit Leakage Power Reduction by Double-Gate Device" International Symposium on low power electronics and design, Newport Beach Marriott Hotel, Newport CA, Aug. 9-11 2004; http://www.islped.org.

J. Kedzierski et al., "High-performance symmetric-gate and CMOS-compatible V, asymmetric-gate FinFET devices" IEDM, 2001, paper 19.5.

B.S. Doyle et al., "High performance fully-depleted tri-gate CMOS transistors" IEEE Electron Device Letters, vol. 24, No. 4, Apr. 2003. pp. 263-265.

B. Doyle et al., "Tri-Gate fully-depleted COMS transistors: fabrication design and layout", 2003 Symposium on VLSI Technology. Digest of Technical Papers, Tokyo; Japan Soc. Applied Phys, 2003, pp. 133-134.

H. Takato et al., "High Performance CMOS Surrounding Gate Transistor (SGT) for Ultra High Density LSls,", IEEE Electron Devices Meeting, Technical Digest, pp. 222-225, 1988.

S. Miyano et al., "Numerical Analysis of a Cylindrical Thin-Pillar Traansistor (CYNTHIA)", IEEE Transactions on Electron Devices, vol. 39, No. 8, Aug. 1990, pp. 1876-1881.

H-S. P. Wong et al., "Self-Aligned (Top and Bottom) Double-Gate MOSFET with a 25nm Thick Silicon Channel", IEEE Int. Electron Device Meeting, 1997, pp. 427-430.

H-J. Cho et al., "A Novel Pillar DRAM Cell For 4Gbit and Beyond", Digest of Technical Papers Symposium on VLSI Technology, Jun. 9-11, 1998, pp. 38-39.

Th. Nirschl et al., "The Tunneling Field Effect Transistor (TFET) as an Add-on for Ultra-Low-Voltage Analog and Digital Processes", IEEE International Electron Devices Meeting, 2004. IEDM Technical Digest, Dec. 13-15, 2004, pp. 195-198.

A. Rahman et al., "Theory of Ballistic Nanotransistors", IEEE Transactions on Electron Devices. vol. 50, No. 9, Sep. 2003, pp. 1853-1864.

P. Xuan et al., "60nm Planarized Ultra-thin Body Solid Phase Epitaxy MOSFETs", IEEE Device Research Conference, Denver, CO. Jun. 2000, pp. 67-68.

P. Kalavade et al., "A Novel sub-10 nm Transistor", IEEE Device Research Conference, Denver CO. Jun. 2000, pp. 71-72.

\* cited by examiner

A-A'

A-A'

A-A'

ULTRA-THIN BODY VERTICAL TUNNELING TRANSISTOR

TECHNICAL FIELD OF THE INVENTION

The present invention relates generally to electronic components and in particular the present invention relates to transistors.

BACKGROUND OF THE INVENTION

Transistor lengths have become so small that current continues to flow when they are turned off, draining batteries and affecting performance. When the gate-source voltage, $V_{gs}$, of a metal oxide semiconductor (MOS) transistor is less than its voltage threshold, $V_t$, it is in the sub-threshold region. This is characterized by a exponential change in drain current with $V_{gs}$. Sub-threshold leakage currents are difficult to control and reduce in conventional nano-scale planar complementary metal oxide semiconductor (CMOS) transistor technology. As technology scales, sub-threshold leakage currents can grow exponentially and become an increasingly large component of total power dissipation. This is of great concern to designers of handheld or portable devices where battery life is important, so minimizing power dissipation while achieving satisfactory performance is an increasingly important goal.

Two-dimensional short channel effects in a typical prior art planar transistor structure, shown in FIG. 1, result in a sub-threshold slope on the order of 120 mV/decade to 80 mV/decade. An ideal slope would be approximately 60 mV/decade, as shown in FIG. 2. The low power supply voltages used in nano-scale CMOS circuits that are now on the order of 2.5 V exacerbate the problem.

The planar transistor of FIG. 1 is comprised of a substrate 100 in which two source/drain regions 101, 102 are implanted. A control gate 103 is formed over the channel region 105 in which a channel forms during operation of the transistor.

Future supply voltages are projected to become even lower, in the range of 1.2 V, as designers try to improve battery life and performance of electronic devices. At such power levels, there will not be enough voltage range to turn on a transistor. A significant voltage overdrive above the threshold voltage is typically required to turn-on a prior art transistor and turn-off the transistor sub-threshold leakage. This can be several multiples of the 100 mV/decade threshold voltage slope illustrated in FIG. 2. For good $I_{on}/I_{off}$ ratios, the sub-threshold leakage current needs to be at least eight orders of magnitude or eight decades below the transistor current levels when the transistor is turned on. With a 1.2 V voltage range, there will not be enough voltage swing to allow both objectives: high on current and low sub-threshold leakage to be accomplished with conventional planar devices.

Gate body connected transistors as previously described in CMOS circuits provide a dynamic or changing threshold voltage, low when the transistor is on and a high threshold when it is off. Another alternative is using dual gated transistors. Yet another alternative is surrounding gate structures where the gate completely surrounds the transistor channel. This allows best control over the transistor channel but the structure has been difficult to realize in practice. Another technique has been to re-crystallize amorphous silicon that passes through a horizontal or vertical hole. None of these techniques, however, can have a sub-threshold slope less than the ideal characteristic of 60 mV/decade for a convention MOSFET.

For the reasons stated above, and for other reasons stated below that will become apparent to those skilled in the art upon reading and understanding the present specification, there is a need in the art for a device structure that has reduced sub-threshold leakage.

SUMMARY

The above-mentioned problems with transistors and other problems are addressed by the present invention and will be understood by reading and studying the following specification.

The present invention encompasses a vertical, ultra-thin body transistor. The transistor is fabricated on a substrate having a source region doped to a first conductivity. An oxide pillar is formed over the source region. Ultra-thin silicon bodies are formed along sidewalls of the oxide pillar. A drain region is formed over the oxide pillar wherein the drain region is doped to an opposite conductivity from the source region. A gate structure is formed over the silicon bodies.

During operation, a bias on the gate induces n-channels to form along the sidewalls of the pillar in each ultra-thin silicon body. Tunneling of electrons occurs from the source valence band to the induced channel regions, resulting in drain current, in response to a drain voltage.

Further embodiments of the invention include methods and apparatus of varying scope.

DETAILED DESCRIPTION

Figure 1:
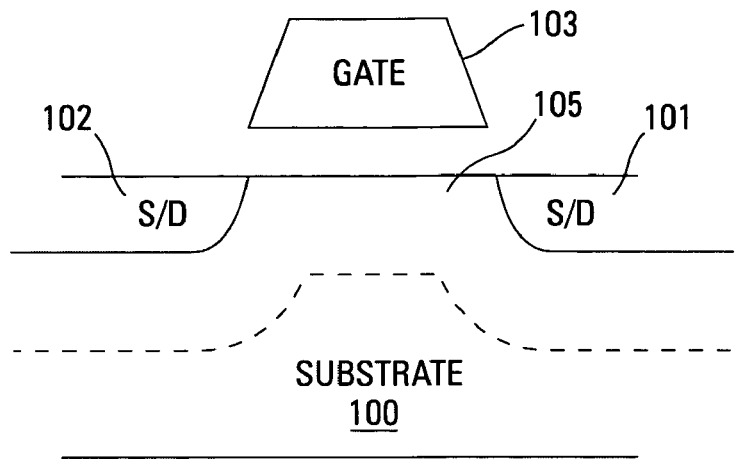
FIG. 1 shows a cross-sectional view of a typical prior art planar CMOS transistor structure.
Figure 2:
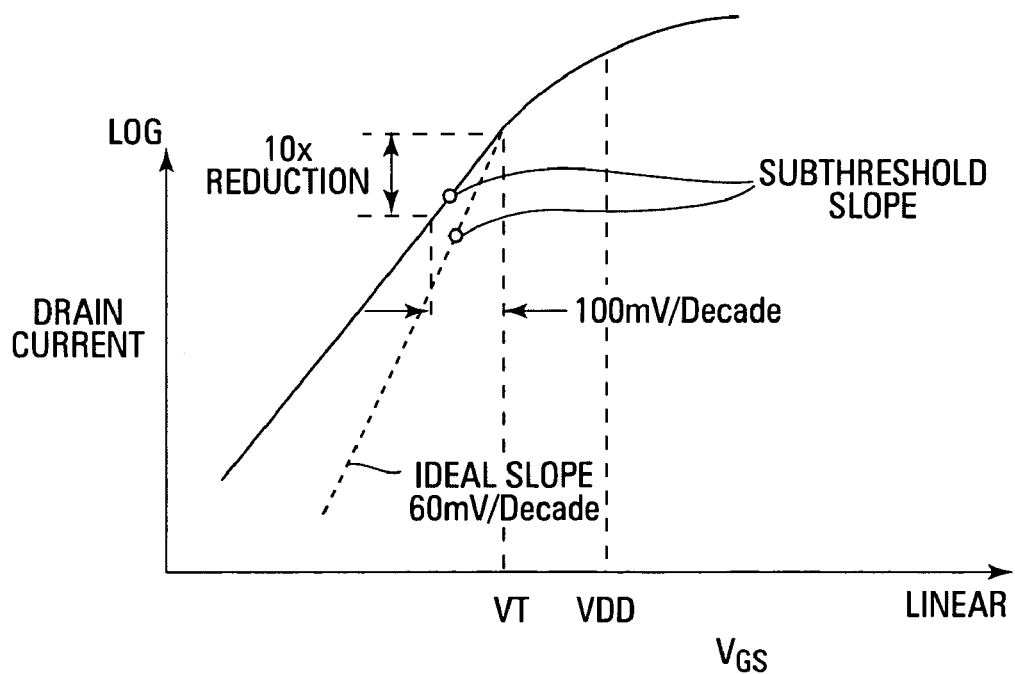
FIG. 2 shows a graphical plot of sub-threshold leakage current for a typical prior art CMOS transistor as compared to an ideal sub-threshold leakage characteristic.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

Figure 3:
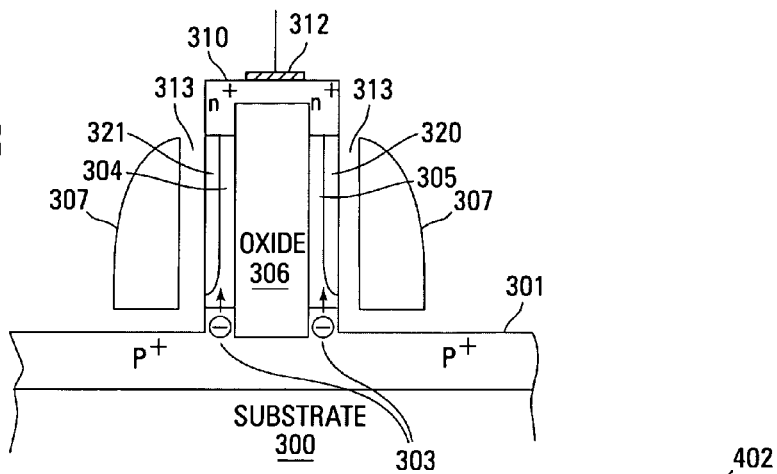
FIG. 3 shows a schematic cross-sectional view of a vertical tunneling, ultra-thin body transistor of the present invention.

FIG. 3 illustrates cross-sectional view of one embodiment for a vertical tunneling, ultra-thin silicon body transistor of the present invention. The illustrated embodiment is formed in an n-type silicon substrate 300 or n+ well. Alternate embodiments may use other conductivity doping for the substrate or other materials for the substrate instead of silicon.

Instead of the conventional n+ source region formed in the substrate 300, the source 303 of the present invention is p+ doped. Additionally, the source wiring 301 that couples the source to other components in a circuit is also p+ doped.

An oxide pillar 306 is formed over the substrate 300. Ultra-thin, lightly doped, p-type body layers 304, 305 are formed along the sides of the oxide pillar 306 to act as body layers. In one embodiment, the present transistor is implemented in 0.1 micron technology such that the transistor has a height of approximately 100 nm and a thickness in the range of 25 to 50 nm. The p-type body layers have a thickness in the range of 5 to 20 nm. Alternate embodiments may use other dimensions. Alternate embodiments may use other heights and/or thickness ranges.

An n+ doped drain region 310 is formed at the top of the silicon bodies 304, 305. A contact 312 is formed on the drain region 310 to allow connection of the transistor's drain region to other components of an electronic circuit. This connection may be a metal or some other material.

A gate insulator layer 313 is formed over the ultra-thin silicon bodies 304, 305 and around the pillar. The insulator can be an oxide or some other type of dielectric material.

A gate structure 307 is formed over the insulator layer 313. As discussed subsequently, the gate structure can be a dual gate, a double gate, a surround gate, or some other type of gate structure. In one embodiment, the gate is comprised of polysilicon. As is well known in the art, proper biasing of the gate 307 induces an n-channel to form in a channel region between the source 303 and drain 310 regions. A more detailed discussion of the operation of the transistor of the present invention is discussed subsequently.

During operation, the embodiment illustrated in FIG. 3 is biased on the gate 307 to induce n-type channels 320, 321 to form in the ultra-thin bodies 304, 305. A drain 310 bias causes tunneling to occur from the source 303 valence band to the n-channels 320, 321 resulting in a drain current.

Figure 4A:
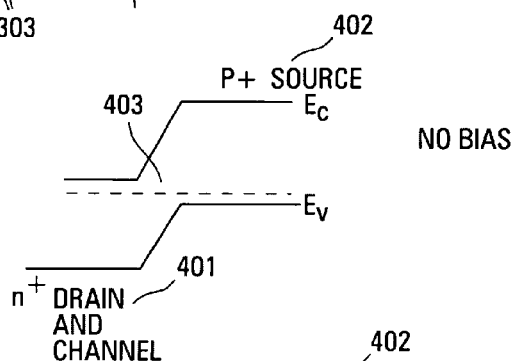
FIGS. 4A and 4B show energy band diagrams of the electrical operation of the transistor embodiment of FIG. 3.
Figure 4B:
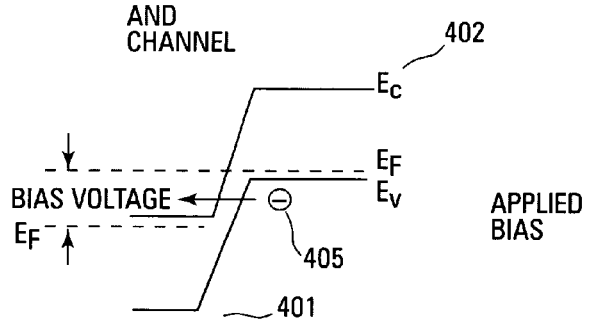

FIGS. 4A and 4B illustrate energy band diagrams of the operation of the transistor of FIG. 3. The upper line of each figure indicating the energy of the conduction band and the lower line indicating the energy of the valence band. FIG. 4A illustrates a no bias condition for the transistor. The diagram shows the channel and n+ drain 401 and p+ source 402. In the non-conducting condition, a large barrier 403 exists between the drain 401 and source 402 regions.

FIG. 4B illustrates that applying a bias to the gate creates a conducting condition in which an electron channel is induced to form where the electron concentration is degenerated. A tunnel junction 405 is formed at the source side 402 of the channel.

Applying a drain bias causes band bending and the n-type region conduction band to be below the valence band edge in the source region. Electrons can then tunnel from the source to the n-channel regions. Since there can be no tunneling until the conduction band edge in the channel is drawn below the valence band in the source, the turn-on characteristic is very sharp and the sub-threshold slope approaches the ideal value for a tunneling transistor of zero mV/decade as illustrated in FIG. 5.

Figure 5:
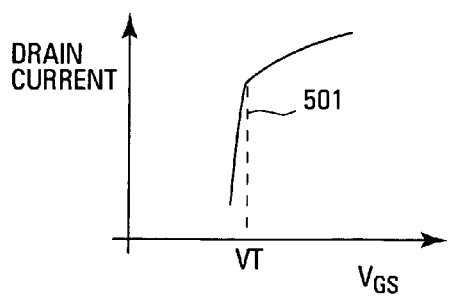
FIG. 5 shows a plot of the sub-threshold leakage current of the transistor embodiment of FIG. 3.

FIG. 5 illustrates a plot of drain current versus the gate-to-source voltage (VGS) of the transistor. This plot shows the very steep sub-threshold slope "S" 501 that results from the biasing of the embodiments of the ultra-thin body transistor of the present invention. The vertical, drain current axis of FIG. 5 is a log scale while the horizontal, VGS axis is linear.

Figure 6:
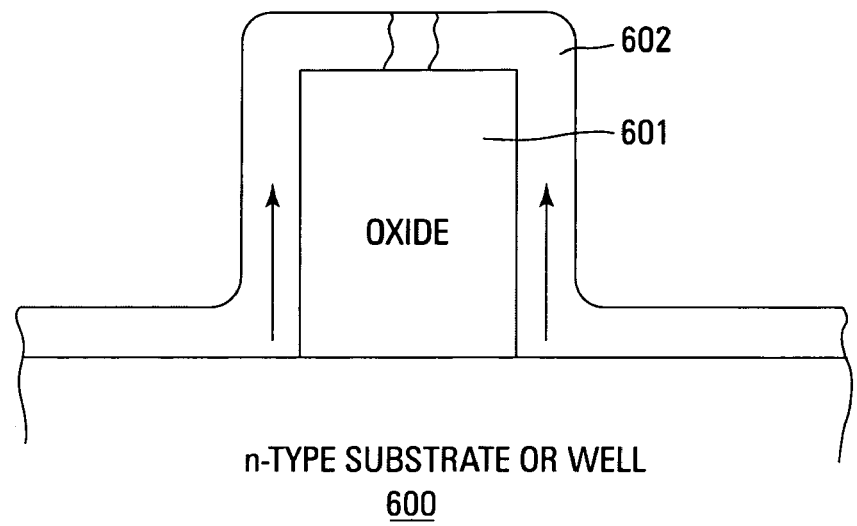
FIG. 6 shows fabrication process steps in accordance with the vertical tunneling, ultra-thin body transistor of the present invention.

FIG. 6 illustrates one embodiment for a method for fabricating the vertical ultra-thin body transistors of the present invention. In this embodiment, oxide pillars 601 are formed by an etch process on the surface of a substrate 600 or well. In one embodiment, the substrate/well 600 is an n-type silicon. Amorphous silicon 602 is re-crystalized over the substrate 600 surface and oxide pillars 601. This can be accomplished by solid phase epitaxial growth.

Figure 7:
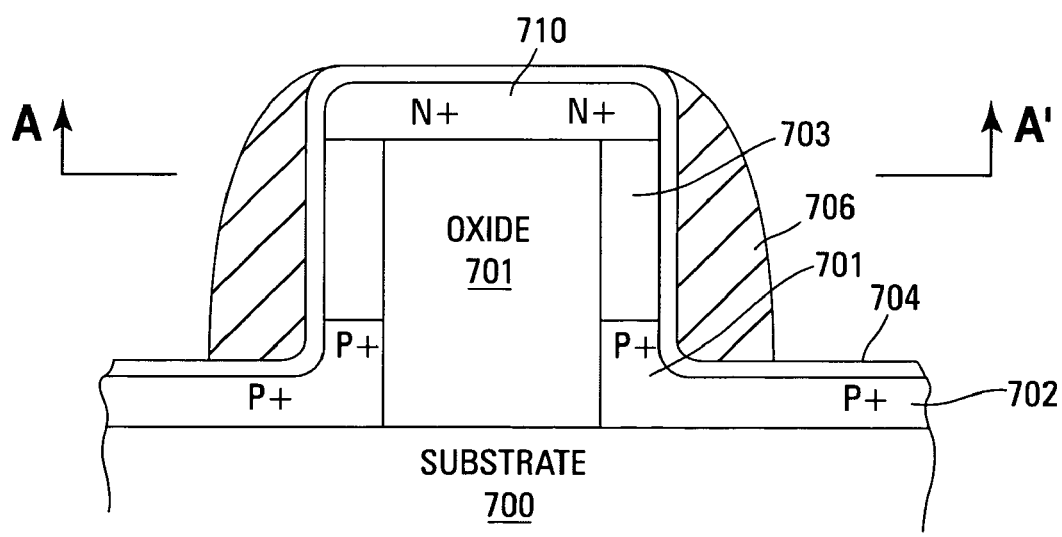
FIG. 7 shows additional fabrication process steps in accordance with the vertical tunneling, ultra-thin body transistor of the present invention.

FIG. 7 illustrates further fabrication steps for the transistor embodiments of the present invention. Doping is performed to form the p+ source 701 and source wiring 702 in the substrate 700. In one embodiment, this is accomplished by an ion implantation operation.

A gate insulator layer 704 is formed over the amorphous silicon layer 703. In one embodiment, the gate insulator layer 704 is an oxide. An n+ drain region 710 is doped into the top of the amorphous silicon layer 703. This can be accomplished by ion implantation. The gate 706 is formed by a sidewall technique. The top of the gate insulator is removed over the drain region and a contact added to the top of the pillar. A cross-section A-A' of FIG. 7 is illustrated in FIGS. 8-10 to show the various embodiments for the gate structures of the present invention.

Figure 8:
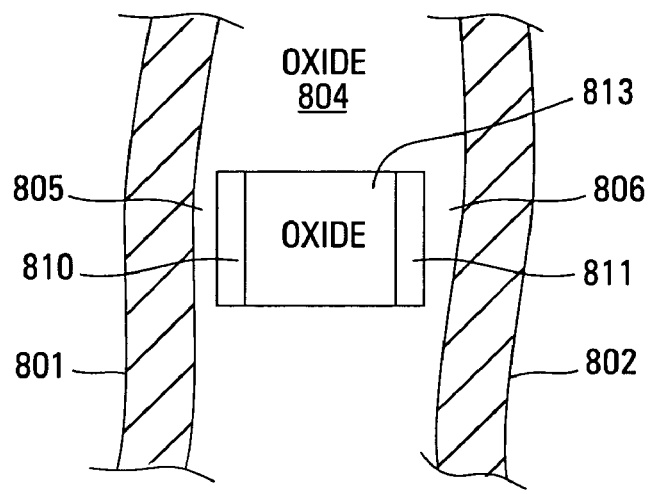
FIG. 8 shows a top cross-section view of one embodiment of a dual gated, ultra-thin body transistor of the present invention along axis A-A' of FIG. 7.

FIG. 8 illustrates a top view of cross-section A-A' of FIG. 7 of a dual gated embodiment of the vertical, ultra-thin body transistor of the present invention. This view shows the two gates 801, 802 formed beside the gate insulators 805, 806. The ultra-thin bodies 810, 811 are located on either side of the oxide pillar 813. This embodiment provides two vertical transistors in which the separate gates 801, 802 are biased separately with two possibly different potentials so that two data bits can be stored. Deposit oxide 804 is a fill oxide separating the gate conductor lines.

Figure 9:
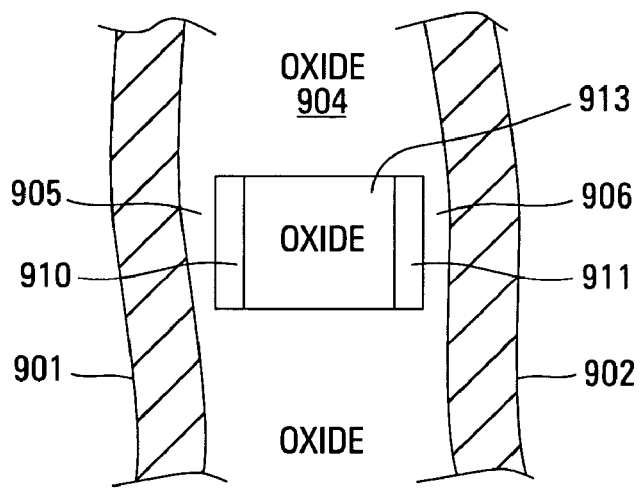
FIG. 9 shows a top cross-sectional view of one embodiment of a double gated, ultra-thin body transistor of the present invention along axis A-A' of FIG. 7.
Figure 10:
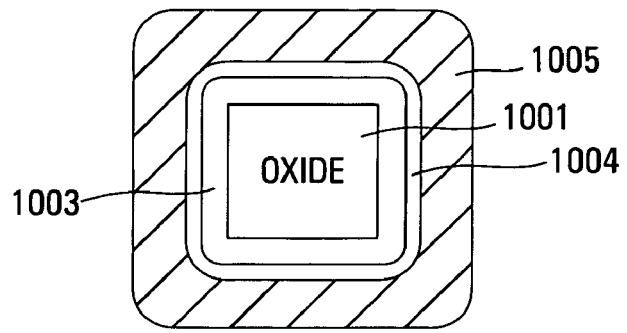
FIG. 10 shows a top cross-sectional view of one embodiment of a surround gate, ultra-thin body transistor of the present invention along axis A-A' of FIG. 7.

FIG. 9 illustrates another alternate embodiment gate structure of the vertical, ultra-thin body transistor of the present invention. This embodiment shows a top cross-sectional view of the transistor along axis A-A' of a double gated embodiment.

This embodiment is comprised of the oxide pillar 913 with the ultra-thin bodies 910, 911 on either side. The deposited oxide 904 acts as the gate dielectric 905, 906 between the gates 901, 902 respectively, and the ultra-thin bodies 910, 911. In this embodiment, the gates are driven with the same potential to provide a single transistor with control by two gates.

FIG. 10 illustrates another alternate embodiment of the vertical, ultra-thin body transistor of the present invention. This embodiment uses a surround gate structure. As FIG. 10 shows, the oxide pillar 1001 is surrounded by the ultra-thin body 1003 instead of on either side as in previous embodiments.

The gate dielectric 1004 surrounds the ultra-thin body 1003. The surrounding gate 1005 is formed around the gate dielectric 1004.

Figure 11:
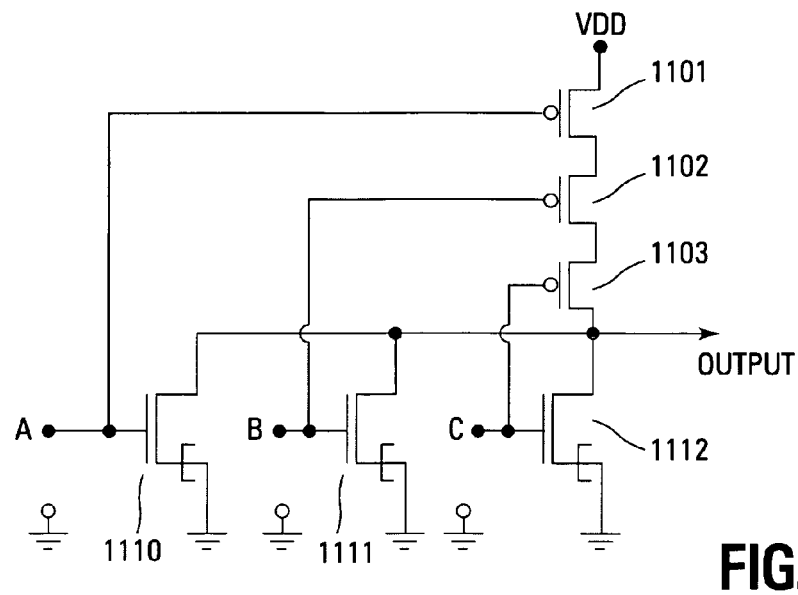
FIG. 11 shows a schematic diagram of one application of the embodiments of the vertical tunneling, ultra-thin body transistor of the present invention in a CMOS logic circuit.

FIG. 11 illustrates one embodiment of an application of the vertical tunneling, ultra-thin body transistor of the present invention. This application incorporates the transistor into a NOR gate CMOS logic circuit. As is well known to one skilled in the art, this circuit operates by the logic levels introduced at the A, B, and C inputs. A logic low input signal on any of these inputs turns on its respective PMOS transistor 1101-1103 and turns off its respective vertical tunneling, ultra-thin body transistor 1110-1112. A logic high input signal has the opposite effect. Turning on any of the vertical tunneling, ultra-thin body transistors 1110-1112 has the effect of pulling the output down to ground (i.e., a logic 0). Turning on all of the PMOS transistors 1101-1103 has the effect of pulling the output up to $V_{DD}$ (i.e., a logic 1).

Figure 12:
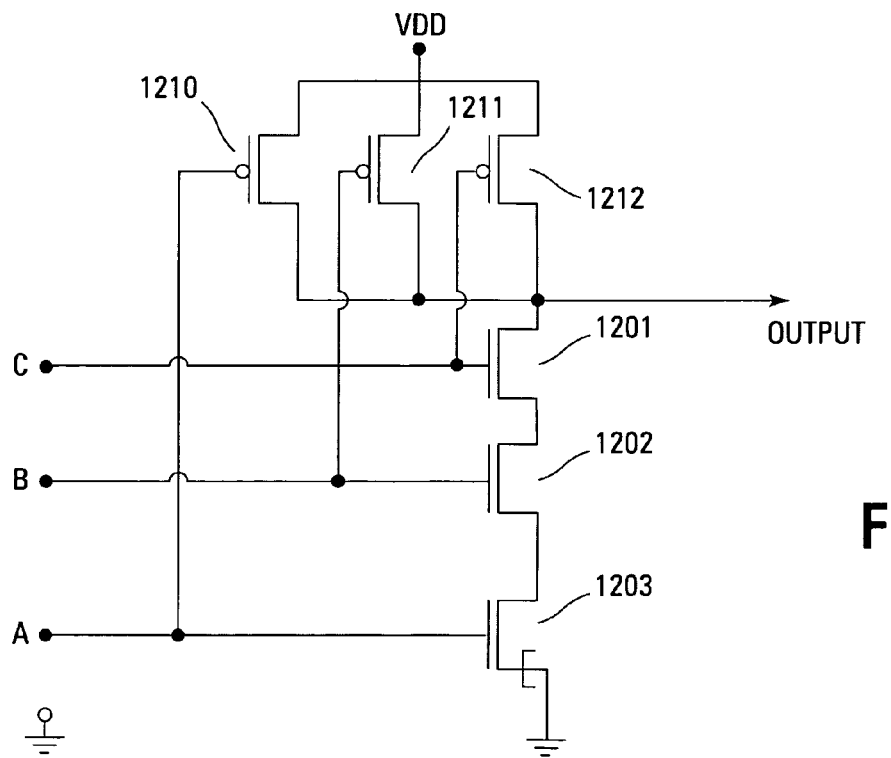
FIG. 12 shows a schematic diagram of another application of the embodiments of the vertical tunneling, ultra-thin body transistor of the present invention in a CMOS logic circuit.

FIG. 12 illustrates another embodiment of an application of the vertical tunneling, ultra-thin body transistor of the present invention. This application incorporates the transistor into a NAND gate CMOS logic circuit by replacing the NMOS transistor closest to $V_{SS}$ with the tunneling, ultra-thin body transistor 1203. As is well known in the art, the NAND circuit operates by a logic low input signal on any of the three inputs A, B, C causes its respective PMOS device 1210-1212 to turn on and pull the output to a logic high. A logic high on all of the inputs turns on the respective NMOS transistors 1201-1202 and vertical tunneling, ultra-thin body transistor 1203 that pulls the output to a logic low.

The ultra-thin body transistors of the present invention, in both of these circuits, provide substantially reduced subthreshold leakage current and, thus, reduced power operation of CMOS circuits. These embodiments are for purposes of illustration only since the vertical tunneling, ultra-thin body transistor of the present invention can be used in any transistor circuit.

Figure 13:
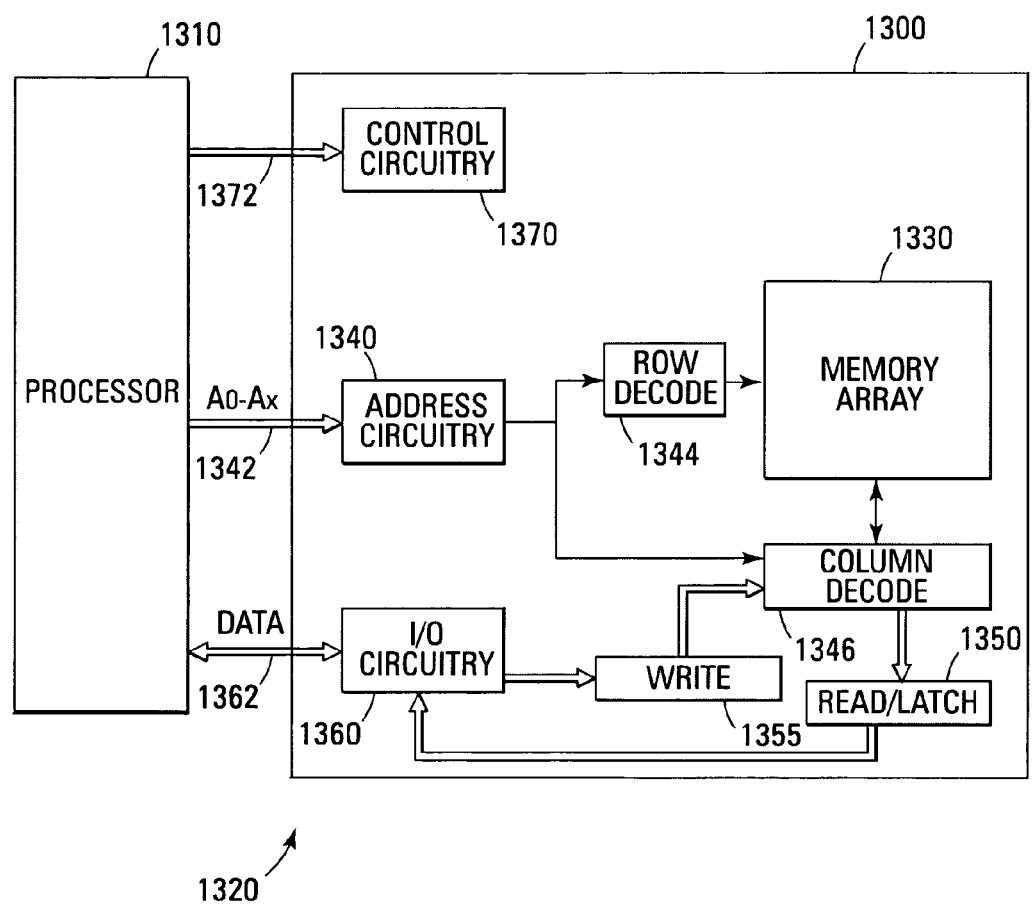
FIG. 13 shows a block diagram of one embodiment of a memory device incorporating the embodiments of the vertical tunneling, ultra-thin body transistor of the present invention.

FIG. 13 illustrates a functional block diagram of a memory device 1300 of one embodiment of the present invention. The memory device 1300 is another embodiment of a circuit that can include the ultra-thin body transistors of the present invention.

The memory device includes an array of memory cells 1330 such as non-volatile memory cells or DRAM type memory cells. The memory array 1330 is arranged in banks of rows and columns along word lines and bit lines, respectively.

An address buffer circuit 1340 is provided to latch address signals provided on address input connections A0-Ax 1342. Address signals are received and decoded by a row decoder 1344 and a column decoder 1346 to access the memory array 1330. It will be appreciated by those skilled in the art, with the benefit of the present description, that the number of address input connections depends on the density and architecture of the memory array 1330. That is, the number of addresses increases with both increased memory cell counts and increased bank and block counts.

The memory device 1300 reads data in the memory array 1330 by sensing voltage or current changes in the memory array columns using sense/latch circuitry 1350. The sense/latch circuitry, in one embodiment, is coupled to read and latch a row of data from the memory array 1330. Data input and output buffer circuitry 1360 is included for bi-directional data communication over a plurality of data connections 1362 with the controller 1310). Write circuitry 1355 is provided to write data to the memory array.

Control circuitry 1370 decodes signals provided on control connections 1372 from the processor 1310. These signals are used to control the operations on the memory array 1330, including data read, data write, and erase operations. The control circuitry 1370 may be a state machine, a sequencer, or some other type of controller.

The memory device illustrated in FIG. 13 has been simplified to facilitate a basic understanding of the features of the memory. A more detailed understanding of internal circuitry and functions of flash memories and/or DRAM's are known to those skilled in the art.

The vertical tunneling, ultra-thin body transistors of the present invention can be used in the memory device of FIG. 13, as well as the subsequently discussed memory module, as select transistors, control transistors, and in logic elements such as NAND and NOR gates as discussed previously.

Figure 14:
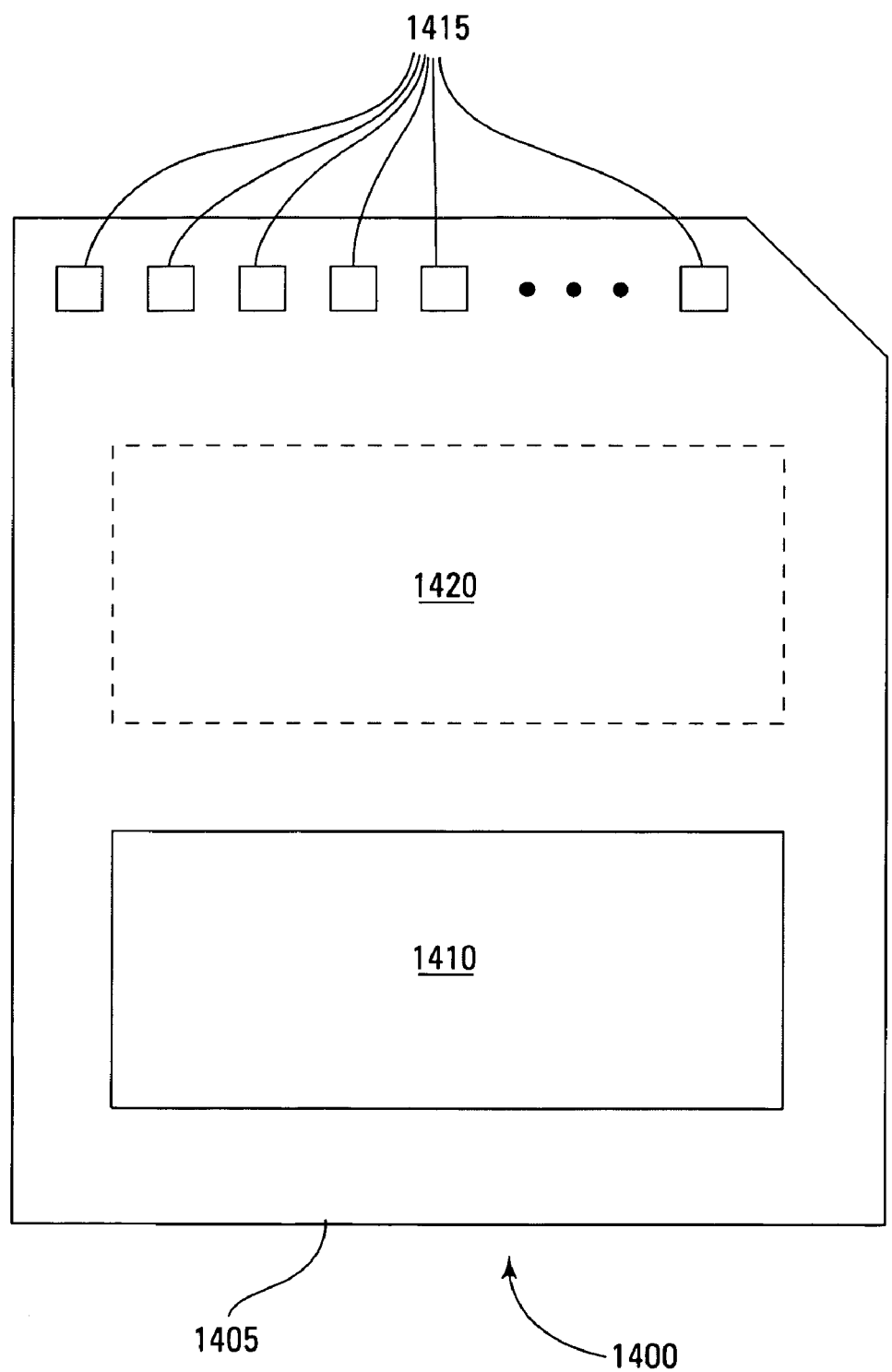
FIG. 14 shows a block diagram of one embodiment of a memory module incorporating the embodiments of the vertical tunneling, ultra-thin body transistor of the present invention.

FIG. 14 is an illustration of an exemplary memory module 1400. Memory module 1400 is illustrated as a memory card, although the concepts discussed with reference to memory module 1400 are applicable to other types of removable or portable memory, e.g., USB flash drives, and are intended to be within the scope of "memory module" as used herein. In addition, although one example form factor is depicted in FIG. 14, these concepts are applicable to other form factors as well.

In some embodiments, memory module 1400 will include a housing 1405 (as depicted) to enclose one or more memory devices 1410, though such a housing is not essential to all devices or device applications. At least one memory device 1410 is a non-volatile memory [including or adapted to perform elements of the invention]. Where present, the housing 1405 includes one or more contacts 1415 for communication with a host device. Examples of host devices include digital cameras, digital recording and playback devices, PDAs, personal computers, memory card readers, interface hubs and the like. For some embodiments, the contacts 1415 are in the form of a standardized interface. For example, with a USB flash drive, the contacts 1415 might be in the form of a USB Type-A male connector. For some embodiments, the contacts 1415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 1415 provide an interface for passing control, address and/or data signals between the memory module 1400 and a host having compatible receptors for the contacts 1415.

The memory module 1400 may optionally include additional circuitry 1420 which may be one or more integrated circuits and/or discrete components. For some embodiments, the additional circuitry 1420 may include a memory controller for controlling access across multiple memory devices 1410 and/or for providing a translation layer between an external host and a memory device 1410. For example, there may not be a one-to-one correspondence between the number of contacts 1415 and a number of I/O connections to the one or more memory devices 1410. Thus, a memory controller could selectively couple an I/O connection (not shown in FIG. 14) of a memory device 1410 to receive the appropriate signal at the appropriate I/O connection at the appropriate time or to provide the appropriate signal at the appropriate contact 1415 at the appropriate time. Similarly, the communication protocol between a host and the memory module 1400 may be different than what is required for access of a memory device 1410. A memory controller could then translate the command sequences received from a host into the appropriate command sequences to achieve the desired access to the memory device 1410. Such translation may further include changes in signal voltage levels in addition to command sequences.

The additional circuitry 1420 may further include functionality unrelated to control of a memory device 1410 such as logic functions as might be performed by an ASIC (application specific integrated circuit). Also, the additional circuitry 1420 may include circuitry to restrict read or write access to the memory module 1400, such as password protection, biometrics or the like. The additional circuitry 1420 may include circuitry to indicate a status of the memory module 1400. For example, the additional circuitry 1420 may include functionality to determine whether power is being supplied to the memory module 1400 and whether the memory module 1400 is currently being accessed, and to display an indication of its status, such as a solid light while powered and a flashing light while being accessed. The additional circuitry 1420 may further include passive devices, such as decoupling capacitors to help regulate power requirements within the memory module 1400.

CONCLUSION

In summary, a vertical tunneling, ultra-thin body transistor NMOS FET has a p+ source, rather than an n+ source as in prior art transistors. In this configuration, electrons tunnel from the p+ source to induced n-channels along the ultra-thin body sidewalls of an oxide pillar. Such a configuration provides an ideal sub-threshold slope that is substantially close to 0 mV/decade and thus obtain low sub-threshold leakage current in CMOS circuits. The substantially reduced leakage current reduces the power requirements for electronic circuits.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A vertical, ultra-thin body transistor comprising:
    a substrate having a source region doped to a first conductivity;
    an oxide pillar formed over the source region;
    ultra-thin silicon bodies formed along sidewalls of the oxide pillar;
    a drain region formed over the oxide pillar wherein the drain region is doped to an opposite conductivity from the source region; and
    a gate formed over the silicon bodies wherein n-channels are created in the silicon bodies between the source and drain regions in response to a bias on the gate.

2. The transistor of claim 1 wherein the transistor is implemented in 0.1 micron technology.

3. The transistor of claim 1 wherein the pillar has a height of 100 nm.

4. The transistor of claim 1 wherein the ultra-thin silicon bodies have a thickness in the range of 5-20 nm.

5. The transistor of claim 1 wherein the source region is a p+ region and the drain region is an n+ region.

6. The transistor of claim 1 and further including a gate dielectric formed between the ultra-thin silicon bodies and the gate.

7. A vertical tunneling, ultra-thin body transistor comprising:
    a substrate having a doped p+ source region;
    an oxide pillar formed over the source region;
    a plurality of ultra-thin silicon bodies, each silicon body formed along a sidewall of the oxide pillar; an n+ drain region formed over the top of the pillar;
    a gate dielectric formed around the pillar and silicon bodies; and
    a gate formed over the gate dielectric wherein n-channels are created in the silicon bodies between the source and drain regions in response to a bias on the gate.

8. The transistor of claim 7 and further including p+ wires doped into the substrate and coupled to the source region.

9. The transistor of claim 7 wherein the bias on the gate and a bias on the drain region causes electron tunneling from the p+ source valence band.

10. The transistor of claim 7 wherein the gate is a surround gate that is formed around the oxide pillar.

11. The transistor of claim 7 wherein the gate is a dual gated structure that is formed on opposing sides of the oxide pillar and each silicon body is formed on the same sides of the oxide pillar as the gates and each gate is adapted to be biased with different voltages.

12. The transistor of claim 7 wherein the gate is a double gated structure that is formed on opposing sides of the oxide pillar and each silicon body is formed on the same sides of the oxide pillar as the gates and each gate is adapted to be biased with the same voltage.

13. A vertical tunneling, ultra-thin body transistor comprising:
    an n-type silicon substrate having an implanted p+ source region;
    an oxide pillar formed over the source region;
    a lightly doped, p-type silicon body formed around the oxide pillar;
    an n+ drain region formed in a silicon layer on top of the pillar;
    a gate oxide formed around the pillar and over the silicon body; and
    a surrounding gate structure formed over the gate oxide wherein n-channels are created in the silicon bodies between the source and drain regions in response to a bias on the surrounding gate and a bias on the drain region causes electron tunneling from the p+ source region valence band.

14. The transistor of claim 13 wherein the gate structure is comprised of polysilicon.

15. The transistor of claim 13 wherein the silicon body is formed to a thickness in the range of 5-20 nm, the transistor is formed to a height of 100 nm and a thickness in the range of 25-50 nm.

16. The transistor of claim 13 wherein the transistor is formed in an n-well of the silicon substrate.

* * * * *